(12) United States Patent
English et al.

(10) Patent No.: US 7,488,902 B2
(45) Date of Patent: Feb. 10, 2009

(54) ELECTROMAGNETIC INTERFERENCE SHIELDING APPARATUS AND METHODS OF MAKING THE SAME

(75) Inventors: Gerald R. English, Glen Ellyn, IL (US); Paul W. Crotty, Jr., East Stroudsburg, PA (US); Daniel C. Green, Kunkletown, PA (US)

(73) Assignee: Laird Technologies, Inc., St. Louis, MO (US)

( * ) Notice: Subject to any disclaimer, the term of this patent is extended or adjusted under 35 U.S.C. 154(b) by 0 days.

(21) Appl. No.: 11/657,932

(22) Filed: Jan. 25, 2007

(65) Prior Publication Data

US 2008/0179086 A1 Jul. 31, 2008

(51) Int. Cl.
*H05K 9/00* (2006.01)
(52) U.S. Cl. .................. 174/382; 174/377; 361/818
(58) Field of Classification Search .......... 174/350, 174/377, 382; 361/800, 816, 818
See application file for complete search history.

(56) References Cited

U.S. PATENT DOCUMENTS

| | | | |
|---|---|---|---|
| 3,816,911 A | 6/1974 | Knappenberger | |
| 5,175,395 A * | 12/1992 | Moore | 174/372 |
| 5,354,951 A * | 10/1994 | Lange et al. | 174/372 |
| 5,365,410 A * | 11/1994 | Lonka | 361/816 |
| 5,414,597 A | 5/1995 | Lindland et al. | |
| 5,436,802 A | 7/1995 | Trahan et al. | |
| 5,495,399 A | 2/1996 | Gore et al. | |
| 5,597,259 A | 1/1997 | Bogaerts et al. | |
| 5,895,884 A | 4/1999 | Davidson | |
| 6,136,131 A | 10/2000 | Sosnowski | |
| 6,377,472 B1 | 4/2002 | Fan | |
| 6,552,261 B2 | 4/2003 | Shlahtichman et al. | |
| 6,649,827 B2 | 11/2003 | West et al. | |
| 6,711,032 B2 | 3/2004 | Sommer | |
| 6,937,297 B2 | 8/2005 | Kang et al. | |
| 6,949,706 B2 | 9/2005 | West | |
| 7,061,773 B2 * | 6/2006 | Chen | 361/816 |
| 2002/0166683 A1 | 11/2002 | Shlahtichman et al. | |
| 2003/0062178 A1 | 4/2003 | West et al. | |

OTHER PUBLICATIONS

Removable Shielding Technologies for PCBs, by Thomas Clupper, W.L. Gore and Associates, http://www.evaluationengineering.com/archive/articles/0106/0106emc_shielding.asp, accessed Nov. 21, 2006, 8 pages.
http://www.tech-etch.com/shield/boardlevelshield.html, accessed Jan. 25, 2007, 5 pages.

* cited by examiner

*Primary Examiner*—Hung V Ngo
(74) *Attorney, Agent, or Firm*—Harness, Dickey & Pierce, P.L.C.

(57) ABSTRACT

According to various aspects of the present disclosure, exemplary embodiments are provided of shielding apparatus that are suitable for use in providing electromagnetic interference shielding for one or more electrical components on a substrate. The shielding apparatus may have partially drawn and partially formed corner sections for improved rigidity. In one exemplary embodiment, a shielding apparatus generally includes side walls configured to be disposed generally about one or more electrical components on a substrate. Corner sections are integrally formed with the side walls. Each corner section has a drawn portion integrally connecting a corresponding pair of side walls, and a lower portion located generally below the drawn portion and generally between side edge portions of the corresponding pair of side walls.

30 Claims, 14 Drawing Sheets

ELECTROMAGNETIC INTERFERENCE SHIELDING APPARATUS AND METHODS OF MAKING THE SAME

FIELD

The present disclosure relates generally to shielding apparatus for electronic systems and devices, and more particularly to shielding apparatus that may have partially drawn and partially formed corner sections for improved rigidity.

BACKGROUND

The statements in this section merely provide background information related to the present disclosure and may not constitute prior art.

Electronic equipment often generates electromagnetic signals in one portion of the electronic equipment which may radiate to and interfere with another portion of the electronic equipment. This electromagnetic interference (EMI) can cause degradation or complete loss of important signals, thereby rendering the electronic equipment inefficient or inoperable. To reduce the adverse effects of EMI, electrically conducting (and sometimes magnetically conducting) material is interposed between the two portions of the electronic circuitry for absorbing and/or reflecting EMI energy. This shielding may take the form of a wall or a complete enclosure and may be placed around the portion of the electronic circuit generating the electromagnetic signal and/or may be placed around the portion of the electronic circuit which is susceptible to the electromagnetic signal. For example, electronic circuits or components of a printed circuit board (PCB) are often enclosed with shields to localize EMI within its source, and to insulate other devices proximal to the EMI source.

As used herein, the term "EMI" should be considered to generally include and refer to both EMI and RFI emissions, and the term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

SUMMARY

According to various aspects of the present disclosure, exemplary embodiments are provided of shielding apparatus that are suitable for use in providing electromagnetic interference shielding for one or more electrical components on a substrate. The shielding apparatus may have partially drawn and partially formed corner sections for improved rigidity. In one exemplary embodiment, a shielding apparatus generally includes side walls configured to be disposed generally about one or more electrical components on a substrate. Corner sections are integrally formed with the side walls. Each corner section has a drawn portion integrally connecting a corresponding pair of side walls, and a lower portion located generally below the drawn portion and generally between side edge portions of the corresponding pair of side walls.

In another exemplary embodiment, a shielding apparatus generally includes an upper surface and side walls integrally formed with and downwardly depending from the upper surface. The side walls are configured to be disposed generally about one or more electrical components on a substrate. The side walls have side edges that are each configured for interlocking engagement with a side edge of a corresponding adjacent side wall. Corner sections are integrally formed with the side walls and the upper surface. Each corner section includes a drawn portion integrally connecting a corresponding pair of side walls and the upper surface. The drawn portion downwardly depends relative to the upper surface. Each corner section also includes a lower portion located generally below the drawn portion. The lower portions includes seams formed by the interlocking engagement of the side edges of the corresponding pair of side walls. For each corner section, there is also an opening located cooperatively defined by the drawn portion and the lower portion of the corner section.

Other aspects relate to methods of making electromagnetic interference shielding apparatus having side walls and a corner section generally between each corresponding pair of side walls. In one exemplary embodiment, a method generally includes drawing a piece of material to form a drawn portion for each corner section that integrally connects a corresponding pair of side walls. This particular method also includes forming the piece of material such that the side walls are configured to be disposed generally about one or more electrical components on a substrate, and such that each corner section includes a lower portion located generally below the drawn portion and generally between side edge portions of the corresponding pair of side walls.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
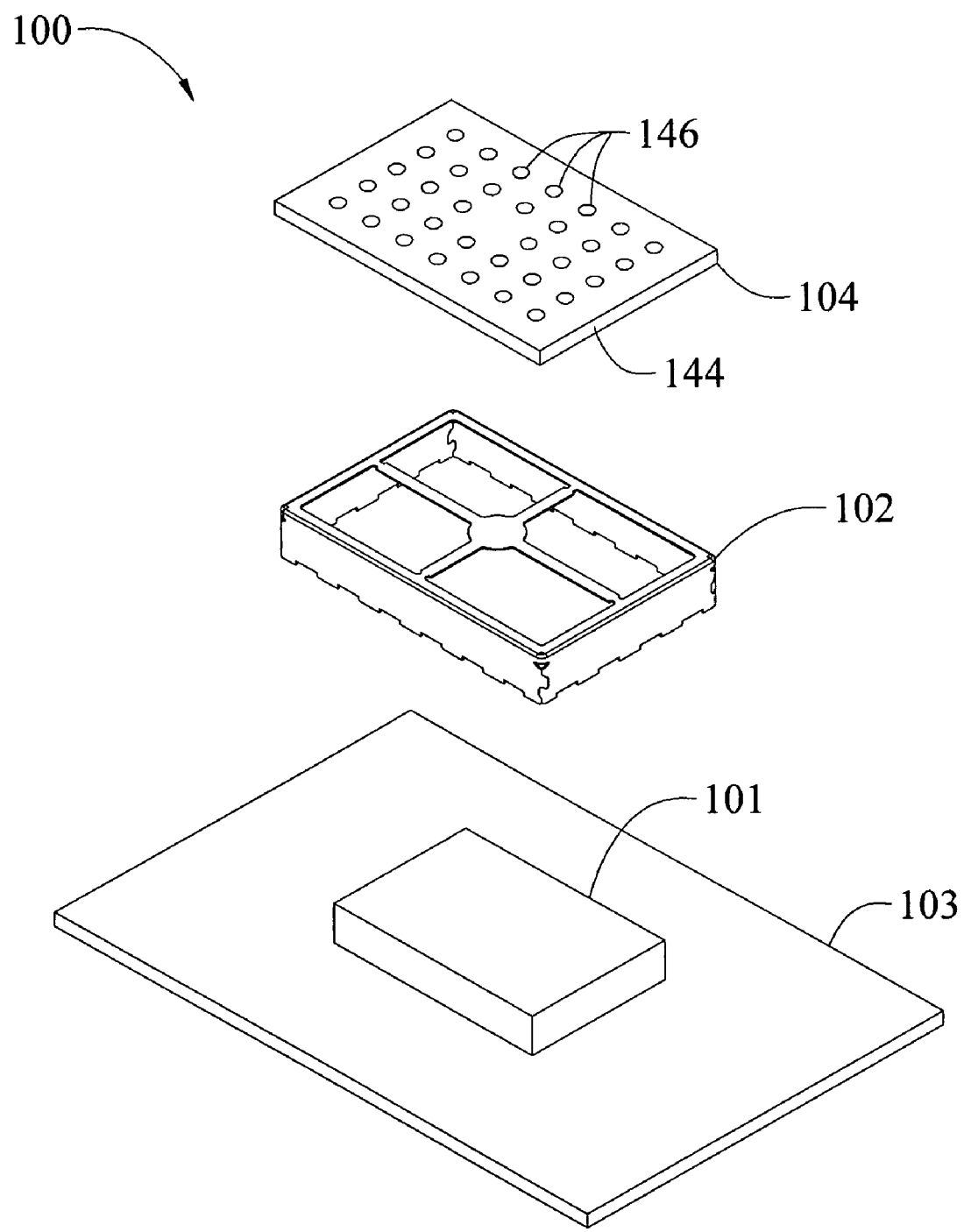
FIG. 1 is an exploded perspective of an exemplary embodiment illustrating a shielding apparatus together with a printed circuit board to which the shielding apparatus may be secured.

The following description is merely exemplary in nature and is not intended to limit the present disclosure, application, or uses. It should be understood that throughout the drawings, corresponding reference numerals indicate like or corresponding parts and features.

As noted above, electronic circuits or components of a printed circuit board (PCB) are often enclosed with shields to localize EMI within its source, and to insulate other devices proximal to the EMI source. One known way to form these shields is by stamping a piece of material using, for example, a die stamping process to form an enclosure, and then folding side portions of the stamped piece of material downward, generally perpendicularly to form side walls. The shield may then be installed to the PCB to enclose the desired electronic circuits or components. Structural integrity of such shields, however, tends to be important. Unfortunately, the folded side walls of the known die stamped shields may be susceptible to deformation before the shields have been installed to PCBs. As recognized by the inventors hereof, shielding apparatus (e.g., frames, shielding can, etc.) configured with partially drawn and partially formed corner sections may advantageously provide improved structural integrity for resisting deformation. By way of example, the increased rigidity may thus provide a benefit prior to installation of the shielding apparatus to a PCB. During installation, flatness requirements can be especially important for ensuring proper contact to the solder paste thickness on the PCB prior to the soldering process. As disclosed herein, the inventors hereof have develops various embodiments of parts with increased rigidity, which, in turn, may aid in maintaining the flatness from the point of forming through installation at the point of use.

As disclosed herein, various aspects of the present disclosure relate to shielding apparatus that are suitable for use in providing electromagnetic interference shielding for one or more electrical components on a substrate. The shielding apparatus may have partially drawn and partially formed corner sections for improved rigidity. In one exemplary embodiment, a shielding apparatus generally includes side walls configured to be disposed generally about one or more electrical components on a substrate. Corner sections are integrally formed with the side walls. Each corner section has a drawn portion integrally connecting a corresponding pair of side walls, and a lower portion located generally below the drawn portion and generally between side edge portions of the corresponding pair of side walls.

In another exemplary embodiment, a shielding apparatus generally includes an upper surface and side walls integrally formed with and downwardly depending from the upper surface. The side walls are configured to be disposed generally about one or more electrical components on a substrate. The side walls have side edges that are each configured for interlocking engagement with a side edge of a corresponding adjacent side wall. Corner sections are integrally formed with the side walls and the upper surface. Each corner section includes a drawn portion integrally connecting a corresponding pair of side walls and the upper surface. The drawn portion downwardly depends relative to the upper surface. Each corner section also includes a lower portion located generally below the drawn portion. The lower portions includes seams formed by the interlocking engagement of the side edges of the corresponding pair of side walls. For each corner section, there is also an opening located cooperatively defined by the drawn portion and the lower portion of the corner section.

Other aspects relate to methods of using and/or methods of making electromagnetic interference shielding apparatus having side walls and a corner section generally between each corresponding pair of side walls. In one exemplary embodiment, a method generally includes drawing a piece of material to form a drawn portion for each corner section that integrally connects a corresponding pair of side walls. This particular method also includes forming the piece of material such that the side walls are configured to be disposed generally about one or more electrical components on a substrate, and such that each corner section includes a lower portion located generally below the drawn portion and generally between side edge portions of the corresponding pair of side walls.

Referring now to the drawings, FIG. 1 is an exploded perspective of an exemplary embodiment of a shielding apparatus 100 embodying one or more aspects. The shielding apparatus 100 is suitable for use in providing electromagnetic interference (EMI) shielding to one or more electrical components 101 on a printed circuit board 103 (a PCB, and more broadly, a substrate).

The illustrated shielding apparatus comprises a frame 102 and a lid (or cover) 104 that may be attached to the frame 102. In this particular embodiment, the frame 102 is advantageously formed by a combination of fabricating processes including drawing the frame over a die, and then folding or bending part of the frame to produce the final desired shape. This method is described in more detail hereinafter. The finally shaped frame 102 is configured to be secured to the PCB 103 by means known in the art. For example, the frame 102 may be secured to the PCB 103 by soldering, mechanical fastening, etc. Together, the frame 102 and lid 104 can enclose the desired electrical components 101 to provide EMI shielding thereto.

Figure 2:
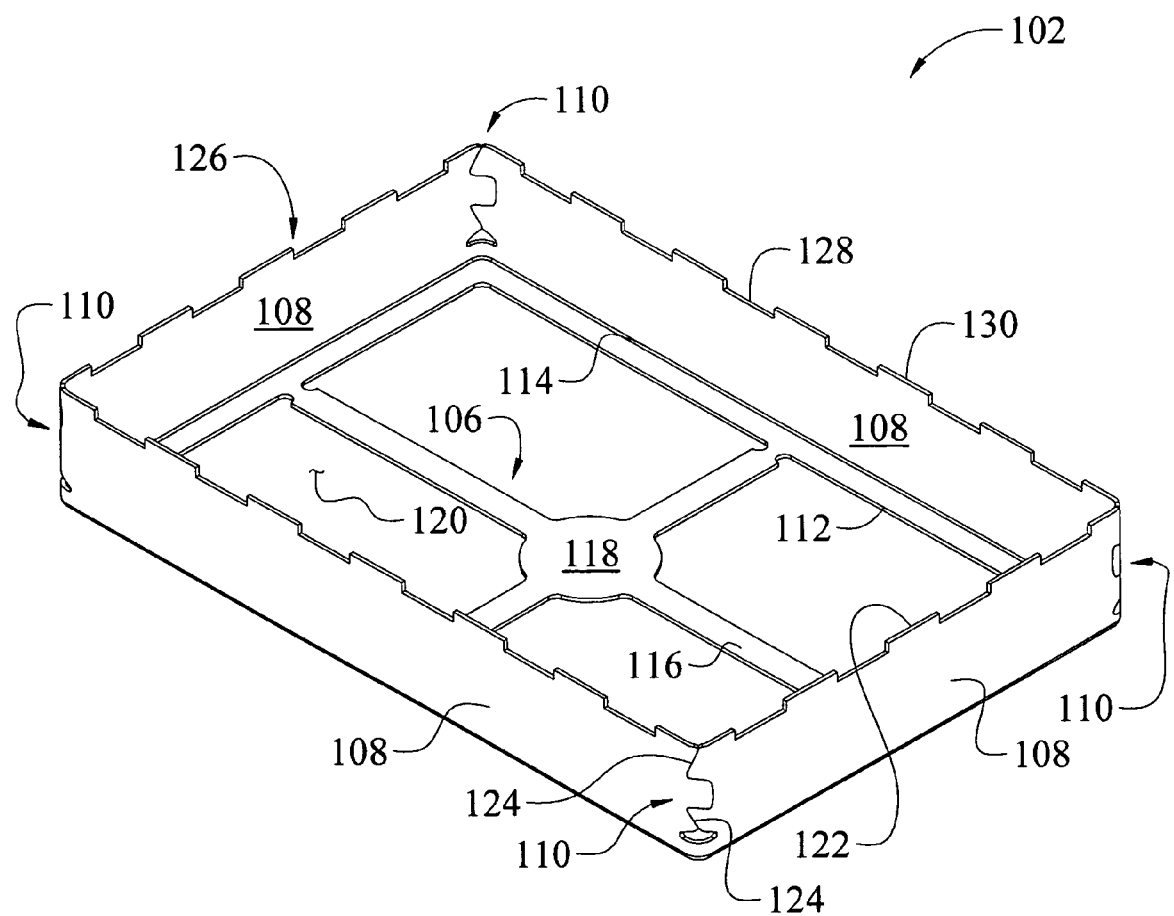
FIG. 2 is a perspective of the frame of the shielding apparatus shown in FIG. 1 with the frame inverted.

With reference to FIGS. 1 and 2, the illustrated frame 102 is generally rectangular in shape and includes an upper surface 106 (or top surface), four side walls 108 formed integrally (or monolithically) with each other and with the upper surface. The frame 102 also includes four corner sections 110 formed integrally with the side walls 108 and upper surface 106. In other exemplary embodiments, at least part of the upper surface 106 may be formed separately from the side walls 108 and corner sections 110 and be separately attached thereto. In still other exemplary embodiments, the frame 102 may include more than or fewer than four side walls 108 and four corner sections 110, and/or side walls in a configuration different from that shown in the figures. For example, the side walls 108 may have a square configuration, a triangular configuration, a hexagonal configuration, another polygonal-shaped configuration, a circular configuration, a non-rectangular configuration, etc.

With continued reference to FIGS. 1 and 2, the frame's upper surface 106, side walls 108, and corner sections 110 are formed from a single piece of electrically-conductive material so as to have an integral, monolithic construction.

A wide range of materials may be used for the frame 102. By way of example, the frame's upper surface 106, side walls 108, and corner sections 110 may be formed from cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. In one exemplary embodiment, the frame 102 is formed from a sheet of cold rolled steel having a thickness of about 0.20 millimeters. As another example, the frame 102 may be configured from a suitable material having a thickness in the range of about 0.10 millimeters and about 0.30 millimeters. The materials and dimensions provided herein are for purposes of illustration only, as the frame may be configured from different materials and/or with different dimensions depending, for example, on the particular application, such as the electrical components to be shielded, space considerations within the overall electronic device, EMI shielding and heat dissipation needs, and other factors.

As previously stated, the frame's upper surface 106 is integrally formed with each of the side walls 108 and corner sections 110. In the illustrated embodiment, the upper surface includes integral flanges 112 that extend as one piece along each of the side walls 108 around the perimeter of the frame 102. Each flange 112 is bent inwardly along a draw line 114 with respect to each side wall 108 so that each flange 112 is oriented generally perpendicularly relative to each side wall 108, with each side wall 108 depending generally downwardly from each corresponding flange 112. In other exemplary embodiments, the upper surface 106 may include flanges 112 with openings therein, and/or may include inwardly folded lips, perimeter rims, etc. In still other exemplary embodiments, the upper surface 106 may include upper edges of the side walls 108.

The upper surface 106 also includes four cross braces 116 interconnecting the flanges 112. The cross braces 116 extend from a middle location of each of the flanges 112 to a central hub 118. The braces 116 are preferably configured to provide stiffening support to the frame 102, for example, to resist deformation (e.g., bending, etc.). The cross braces 116 may also be configured to help maintain the side walls 108 in the generally rectangular shape of the frame 102. In other exemplary embodiments, the cross braces 116 may extend from other locations of the flanges 112 (e.g., from corners of the flanges, etc.), and/or the cross braces 116 may extend directly to other locations of the flanges 112 without using a central hub 118. In still other exemplary embodiments, the upper surface 106 may include no cross braces. Or, the upper surface 106 may include more than or fewer than four cross braces 116 and/or in different orientations.

In the illustrated embodiment, the flanges 112 and cross braces 116 define four openings 120 in the upper surface 106. These openings 120 may be used, for example, to access the electrical components 101 of the PCB 103 contained within the frame 102 after the frame 102 is attached to the PCB 103. In this embodiment (and embodiments in which the frame does not include any cross-braces), the frame 102 may be viewed as an open-top EMI shielding can. In other exemplary embodiments, there may be more or less openings 120 in different sizes and/or shapes than what is illustrated in the figures.

Referring still to FIGS. 1 and 2, the side walls 108 of the frame 102 are configured to generally surround certain electrical components 101 on the PCB 103 when the frame 102 is attached to the PCB 103. As shown, each side wall 108 is substantially planar in shape. Adjacent side walls 108 are oriented generally at right angles to each other, and opposing side walls 108 are generally parallel, thereby producing the generally rectangular shape of the illustrated frame 102.

Each side wall 108 includes a lower edge portion 122 and a side edge portion 124 extending upward from the lower edge portion 102. Each lower edge portion 122 is substantially co-planar with the lower edge portions 122 of the other side walls 108. This co-planarity helps to provide a good mating surface with the PCB 103.

Figure 3:
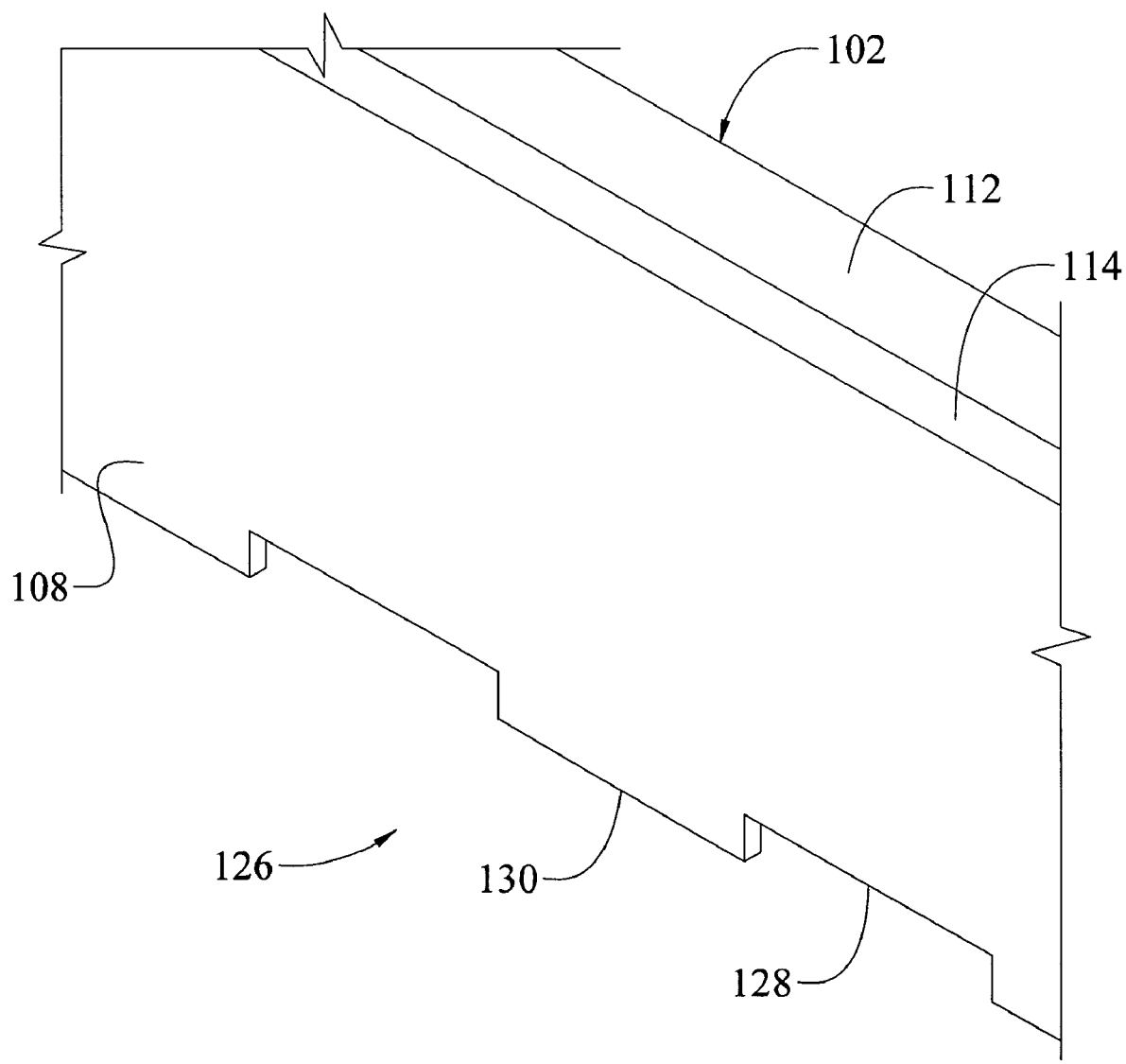
FIG. 3 is a partial perspective of a side wall of the frame shown in FIG. 2 and illustrating castellations formed along a lower edge portion of the side wall.

With reference now to FIG. 3, each lower edge portion 122 is also formed with castellations 126 (e.g., formations with alternating notches 128 and projections 130, etc.). The castellations 126 are preferably configured to provide structure for connecting the frame 102 to the PCB 103. For example, some exemplary embodiments have castellations 126 that provide areas for soldering the frame 102 to the PCB 103. In such embodiments, the notches 128 allow solder to flow around the projections 130 for securing the frame 102 to the PCB 103. In other embodiments, the projections 130 of the castellations 126 may fit in corresponding openings in the PCB 103 for securing the frame 102 to the PCB 103. Depending on the particular application, the castellations 126 may also be configured to allow for air flow to improve temperature uniformity during the reflow process as well as for convection cooling during device operation. The castellations 126 may also allow for fluid flow if washing processes are used on the completed PCB. In those installations in which segmented solder traces are used that correspond with or match the castellations 126, the molten solder may also be confined to a local area to thereby improve reflow process window. In still further embodiments, the frame 102 may not include any such castellations 126 along its lower edge portions 122. In which cases, the frame 102 may include generally straight lower edges portions 122. In addition, alternative means besides soldering may also be employed for securing the frame 102 to the PCB 103.

Figure 4:
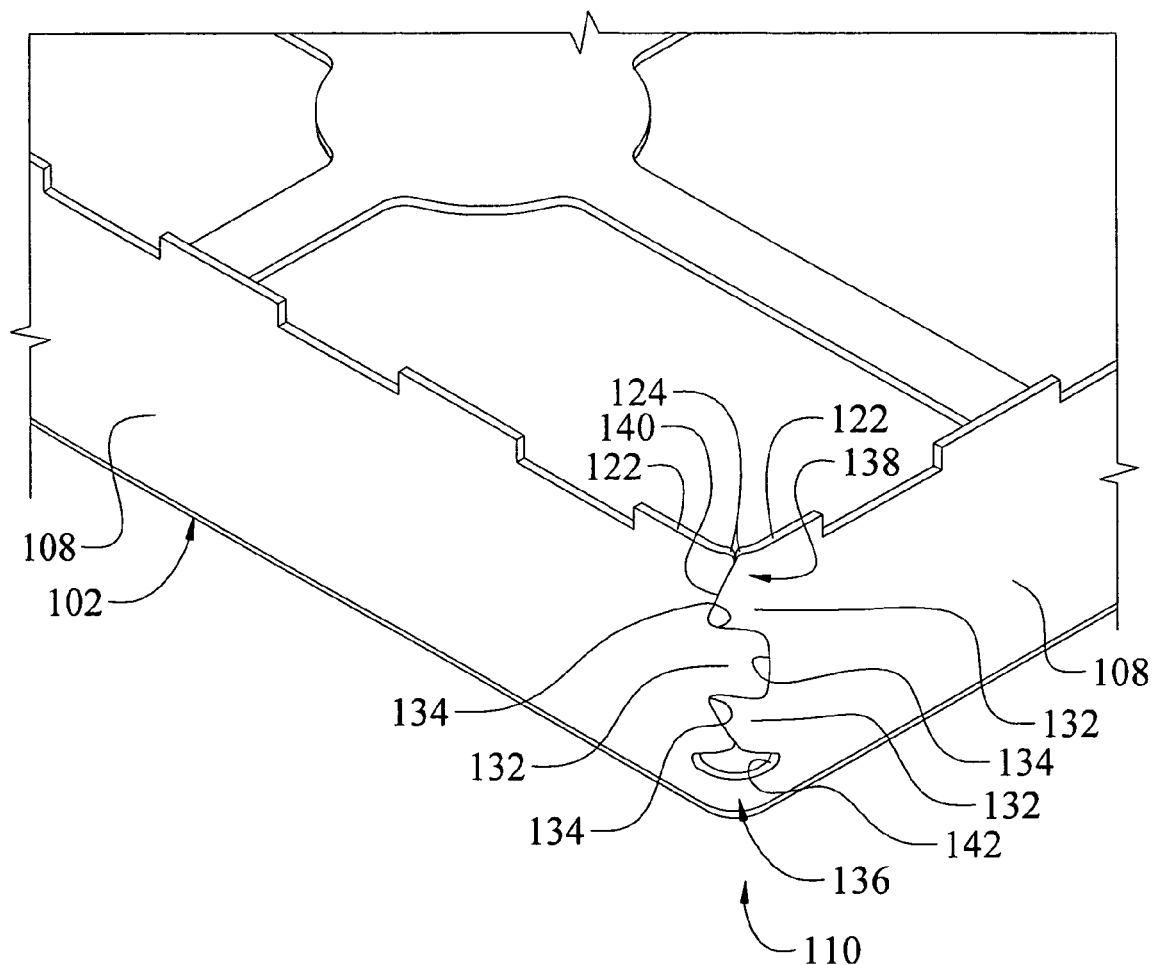
FIG. 4 is a partial perspective of the frame shown in FIG. 2 illustrating (the exterior of) a corner section of the frame in which side edge portions of adjacent side walls interconnect to form a lower portion of the corner section.

As shown in FIG. 4, the side edge portion 124 of each side wall 108 is an edge that extends away from the lower edge portion 122 along each side wall 108. In this particular embodiment, the side edge portions 124 of adjacent side walls 108 are shown engaged at the corner sections 110 along a seam 140. The side edge portions 124 of adjacent side walls 108 are generally rounded and keyed in shape for interconnection. For example, the side edge portion 124 of one side wall 108 (e.g., the side wall 108 to the left in FIG. 4) includes one finger or protrusion 132 and two recesses 134. Correspondingly, the side edge portion 124 of an adjacent side wall 108 (e.g., the side wall 108 to the right in FIG. 4) includes two fingers or protrusions 132 and one recess 134. Accordingly, the fingers 132 of one side wall 108 are oriented to fit within the corresponding recesses 134 of the adjacent side wall 108 to thereby provide an interlocking engagement between the side edge portions 124 of the adjacent side walls 108. This interlocking engagement is preferably configured so as to improve the rigidity or the frame 102, to help ensure proper alignment of the side walls 108 relative to one another, and to help ensure that the lower edge portions 122 of the side walls are generally aligned and co-planar for providing a good mating surface with the PCB 103.

Figure 5:
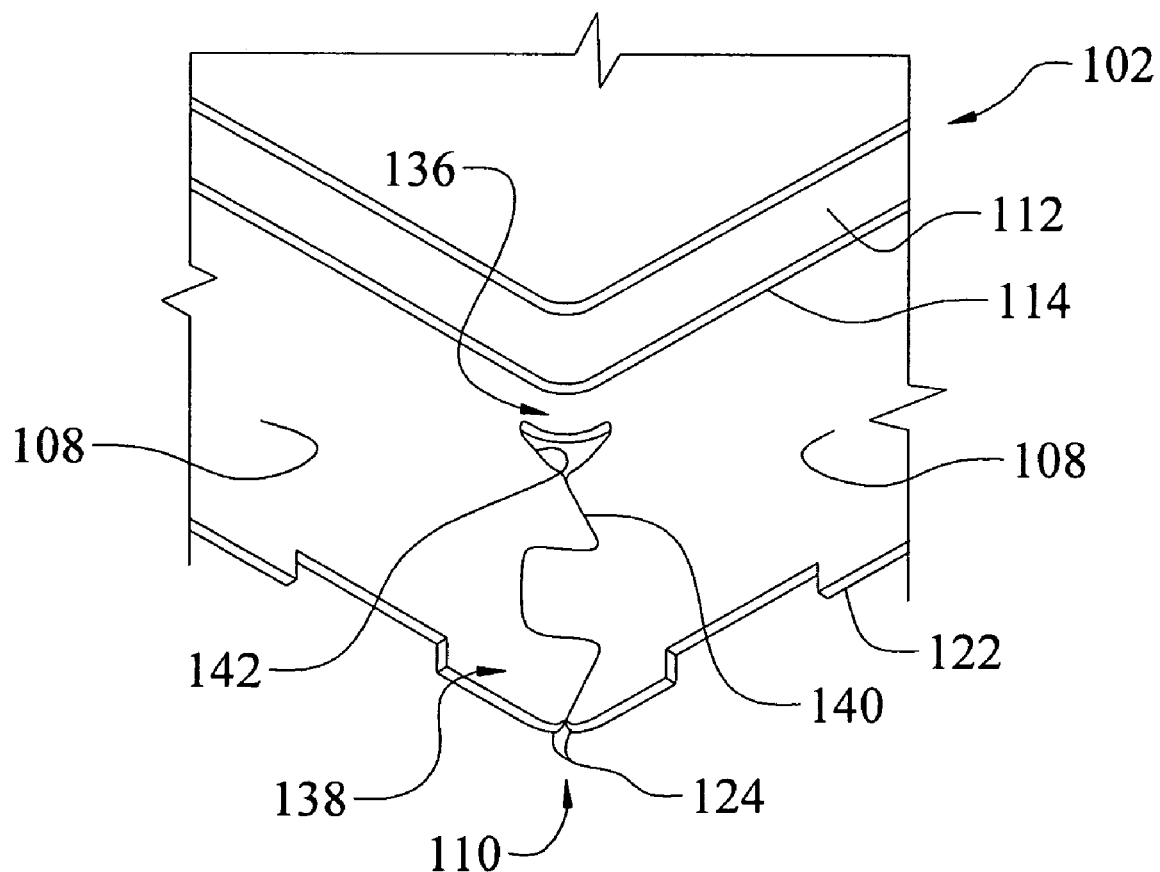
FIG. 5 is a partial perspective illustrating a corner section from inside the frame shown in FIG. 1.

Referring now to FIG. 5, one of the frame's corner section 110 is illustrated generally from inside the frame 102. While only one corner section 110 is shown in FIG. 5 and described hereinafter, the other corner sections 110 of the frame 102 are substantially identical such that a description of the other corner sections 110 would essentially be the same.

As shown in FIG. 5, the corner section 110 includes a drawn portion 136 and a folded portion 138 formed by interconnection of the side edge portions 124 of the adjacent side walls 108. In the illustrated embodiment, both the upper drawn portion 136 and the lower folded portion 138 are generally rounded in shape.

The upper drawn portion 136 integrally connects the adjacent side walls 108 and corresponding flange 112 of the frame 102. The upper drawn portion 136 is integral with the adjacent side walls 108 and corresponding flange 112, such that the side walls 108 and upper drawn portion 136 depend generally downwardly relative to the flange 112.

The lower portion 138 is located generally below the upper drawn portion 136. The lower portion 138 is defined by the interlocking side edge portions 124 of the adjacent side walls 108 such that a seam 140 is formed thereby. An opening 142 is located between and cooperatively defined by the upper drawn portion 136 and the lower portion 138 such that the opening 142 generally separates the upper and lower portions 136 and 138 of the corner section 110.

In the illustrated embodiment, the seam 140 extends the length of the lower portion 138 of the corner section 110. In other exemplary embodiments, the seam 140 may extend only part of the length of the lower portion 138. In still other exemplary embodiments, the opening 142 may be located differently than illustrated in the figures. For example, alternative embodiments may not include any openings in the corner section 110. In further embodiments, one or more openings 142 may be additionally or alternatively located along the length of the lower portion 138. For example, one of the side edge portions 124 may include a recess 134 to which the adjacent mating side edge portion does not include a finger 132 for fitting in the recess.

The upper drawn portions 136 of the corner sections 110 are preferably configured to increase the rigidity of the frame 102. For example, the integral construction of the upper drawn portions 136 with the adjacent side walls 108 and the corresponding flanges 112 at the corner sections 110 preferably provides improved structural strength to the frame 102. This improved structural strength may help reduce undesired deformation (e.g., bending, etc.) as compared to other constructions (e.g., constructions where the frame is formed by folding the side walls down directly from the flanges without any drawn portions, etc.).

Referring again to FIGS. 1 and 2, the illustrated frame 102 may be configured for handling by pick-and-place equipment (e.g., vacuum pick-and-place equipment, etc.). To this end, the central hub 118 may be configured (e.g., sized, shaped, etc.) for use as a frame pick-up area that may be gripped or to which suction may be applied by the pick-and-place equipment for handling during, for example, fabrication of the frame 102 and/or installation of the frame to the PCB 103. In other exemplary embodiments, the frame 102 may include, for example, tabs at the corners and/or along the side walls 108 as pick-up areas in addition to or in place of the central hub 118.

FIG. 1 also illustrates an exemplary lid 104 of the shielding apparatus 100. As shown, the lid 104 is configured (e.g., sized, shaped, etc.) to fit generally over the frame 102 for covering the openings 120 in the upper surface 106 thereof. At which point, the frame 102 and lid 104 may thus provide shielding to the one or more electrical components 101 on the PCB 103 within the area cooperatively defined by the frame 102 and lid 104.

The lid 104 is shown with a generally rectangular shape corresponding to the shape of the frame 102. The lid 104 includes sides 144 configured to fit generally over at least a portion of the side walls 108. Alternatively, the lid 104 may include more than or fewer than four sides 144 and/or may include sides in a configuration different from that shown in the figures. For example, the lid's sides may have a square configuration, a triangular configuration, a hexagonal configuration, another polygonal-shaped configuration, a circular configuration, a non-rectangular configuration, etc.

In addition, the illustrated lid 104 includes a plurality of apertures or holes 146. These holes 146 may facilitate solder reflow heating interiorly of the lid 104, may enable cooling of the electrical components 101, and/or may permit visual inspection of portions of the electrical components 101 beneath the lid 104. In some embodiments, the holes 146 are sufficiently small to inhibit passage of interfering EMI/RFI. The particular number, size, shape, orientation, etc. of the holes 146 may vary depending, for example, on the particular application (e.g., sensitivity of the electronics where more sensitive circuitry may necessitate the use of smaller diameter holes, etc.). For example, some embodiments include a lid without any such holes.

In the illustrated embodiment, the lid 104 may be secured to the frame 102 by soldering. In other exemplary embodiments, the lid 104 may be releasably secured to the frame 102 in a manner that permits the lid to be fairly easily removed and replaced onto the frame 102. For example, some embodiments include the frame's side walls being provided with protuberances that are configured to align with and be retained by corresponding openings formed in the sides of the lid. In other embodiments, the frame's side walls may comprise one or more retaining openings (e.g., recesses, voids, cavities, slots, grooves, holes, depressions, combinations thereof, etc.) configured to align with and engagingly receive one or more protuberances (e.g., catches, snaps, latches, tabs, detents, protuberances, protrusions, ribs, ridges, ramp-ups, darts, lances, dimples, half-dimples, combinations thereof, etc.) formed in the sides of the lid. In still other embodiments, the frame's side walls may include one or more retaining apertures and one or more protuberances. Alternatively, other means can be employed for attaching the lid to the frame besides the engagement of protuberances within openings.

The lid 104 may be formed from a wide range of materials, which are preferably electrically-conductive materials. For example, the lid 104 may be formed from cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. In one exemplary embodiment, the lid 104 is formed from a sheet of cold rolled steel having a thickness of about 0.20 millimeters. As another example, the lid 102 may be configured from a suitable material having a thickness in the range of about 0.10 millimeters and about 0.30 millimeters. The materials and dimensions provided herein are for purposes of illustration only, as the lid may be configured from different materials and/or with different dimensions depending, for example, on the particular application, such as the electrical components to be shielded, space considerations within the overall electronic device, EMI shielding and heat dissipation needs, and other factors.

In other exemplary embodiments, the lid 104 may be formed integrally as a single component with the frame 102.

For example, the upper surface 106 may comprise a planar upper surface that extends substantially across the frame 102 from one side wall 108 to another side wall 108, whereby the planar upper surface is integral with the corner sections 110 and side walls 108. In such embodiments, the planar upper surface operates as a cover or lid for the shielding apparatus 100. In which case, the shielding apparatus 100 is operable for shielding one or more electrical components 101 on the PCB 103 that are within an interior cooperatively defined by the side walls 108, corner sections 110, planar upper surface, and at least a portion of the PCB 103. In some embodiments, the planer upper surface may include one or more through holes or openings for ventilation, etc.

Figure 6:
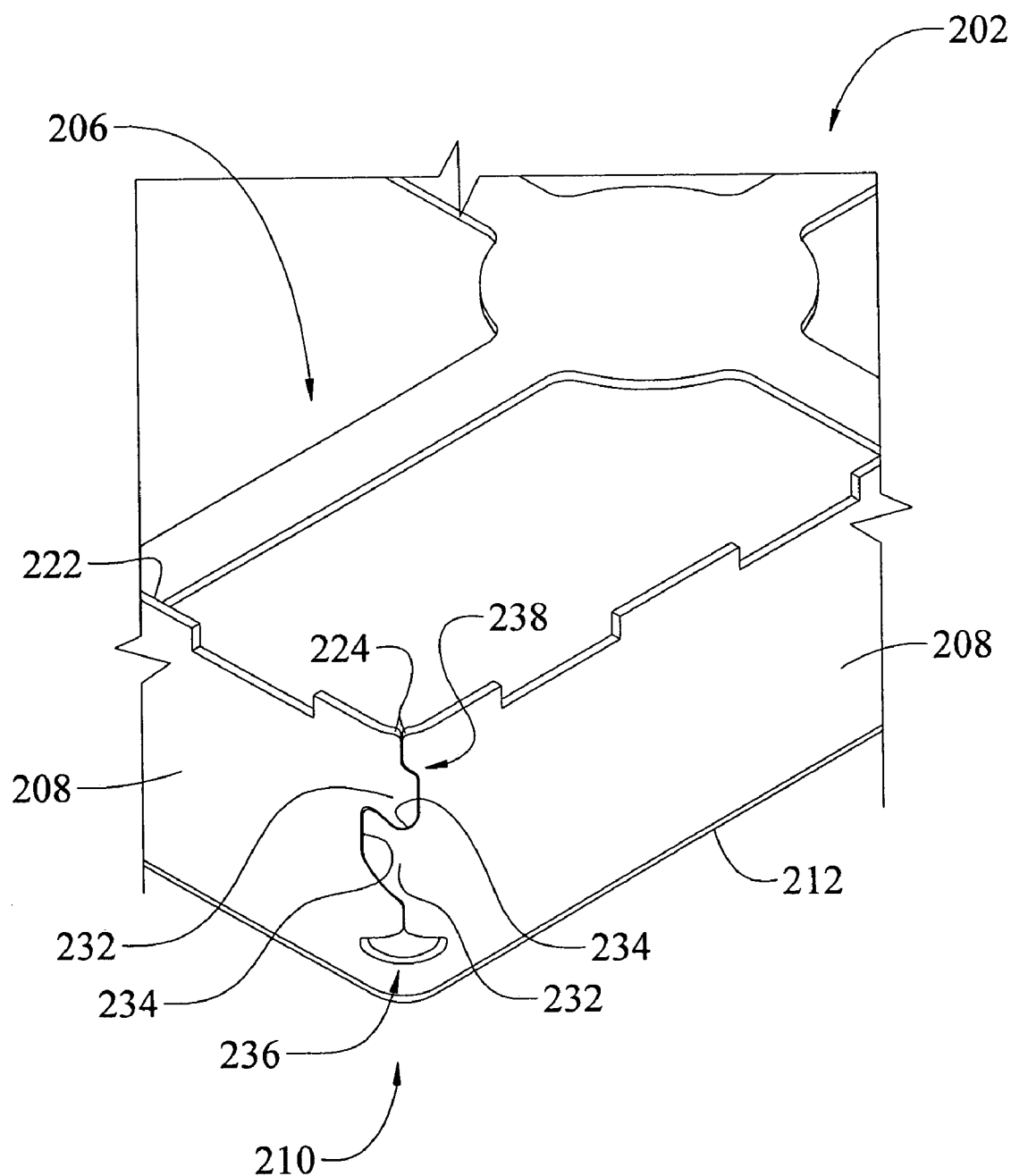
FIG. 6 is a partial perspective of another exemplary embodiment of a frame of a shielding apparatus with the frame inverted to better illustrate (the exterior on a corner section of the frame formed by another interconnection of side edge portions of adjacent side walls.

FIG. 6 illustrates a corner section 210 of a frame 202 of a shielding apparatus according to another exemplary embodiment of the invention. While only one corner section 210 is illustrated in FIG. 6 and described hereinafter, a description of the other corner sections 210 of the frame 202 is the same. In this embodiment, the frame 202 includes side walls 208 having side edge portions 224 formed with a different configuration of mating fingers 232 and recesses 234 for providing an interlocking engagement between the side edge portions 224 of adjacent side walls 208. As shown in FIG. 6, in this embodiment the side edge portions 224 of the adjacent side walls 208 each include one finger 232 and one recess 234 oriented to interconnect.

Figure 7:
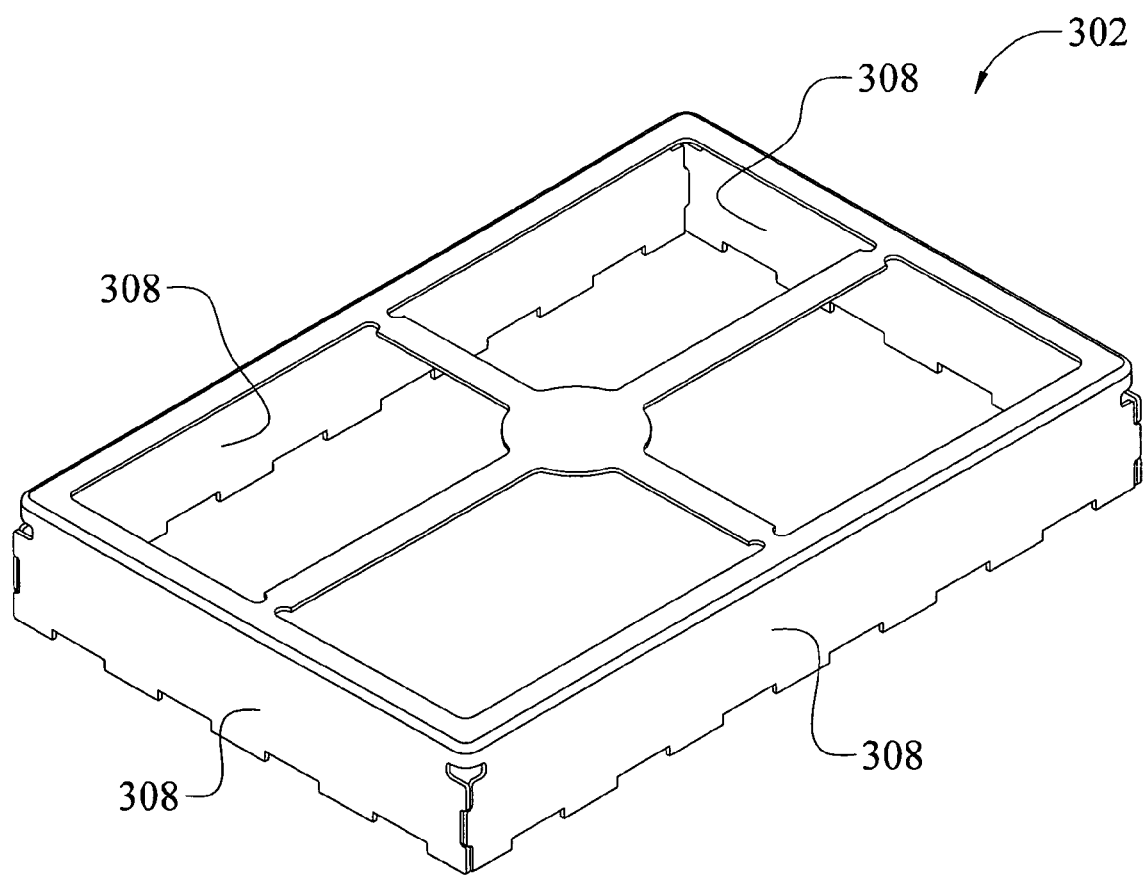
FIG. 7 is a perspective of another exemplary embodiment of a frame of a shielding apparatus.
Figure 8:
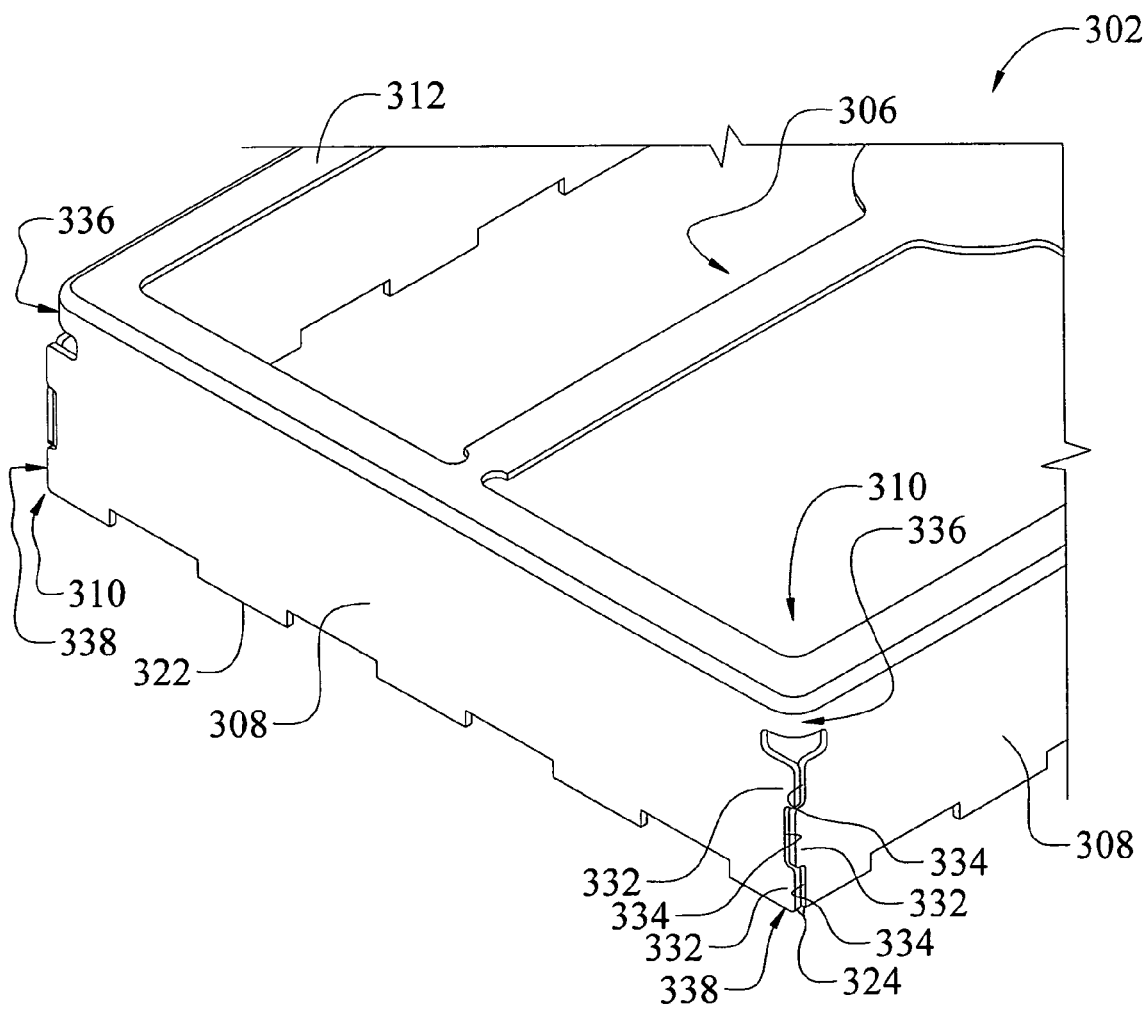
FIG. 8 is a partial perspective of the frame shown in FIG. 7 and illustrating (the exterior of) a corner section having a generally square-shaped lower portion formed by another interconnection of side edge portions of adjacent side walls.

FIGS. 7 and 8 illustrate a frame 302 according to still another exemplary embodiment. In this embodiment, the frame 302 includes side walls 308 having side edge portions 324. The side edge portions 324 are formed with a different configuration of mating fingers 332 and recesses 334 for providing an interlocking engagement between the side edge portions 324 of adjacent side walls 308.

As shown in FIG. 8, the interlocking side edge portions 324 engage to form generally square-shaped lower portions 338 of the corner sections 310. The side edge portion 324 of one side wall 308 (e.g., the left side wall 308 in FIG. 8) includes two fingers 332 and one recess 334, and the side edge portion 324 of an adjacent side wall 308 (e.g., the right side wall 308 in FIG. 8) includes one finger 332 and two recesses 334. The fingers 332 and recesses 334 of the side edge portions 324 of the adjacent side walls 308 are oriented to interconnect to form the generally square-shaped lower portions 338 of the corner sections 310.

Figure 9:
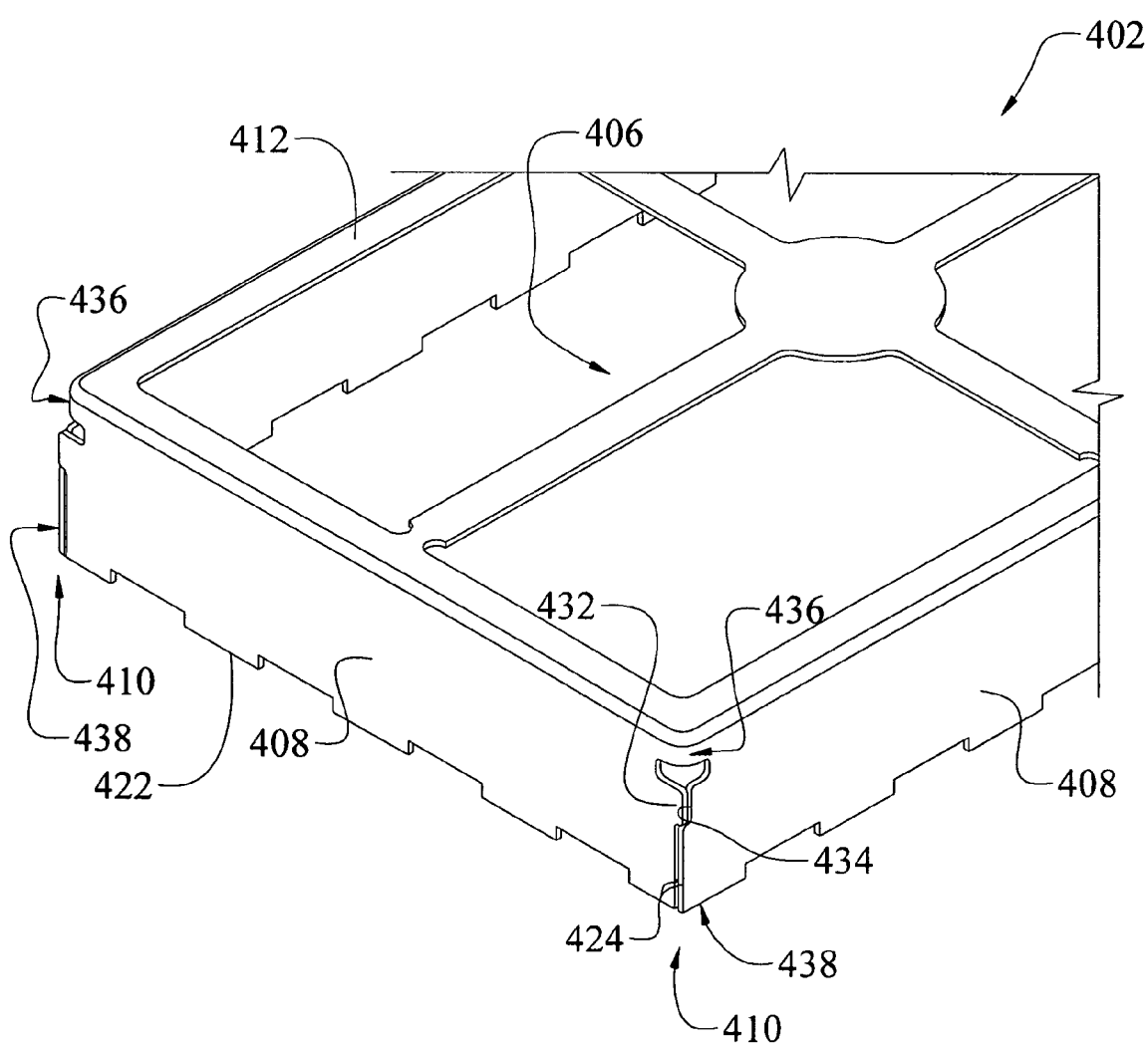
FIG. 9 is a partial perspective of another exemplary embodiment of a frame of a shielding apparatus where the frame includes corner sections each with a generally square-shaped lower portion formed by still another interconnection of side edge portions of adjacent side walls.

FIG. 9 illustrates corner sections 410 of a frame 402 according to yet another exemplary embodiment. While only two corner sections 410 are illustrated in FIG. 9 and described hereinafter, a description of the other corner sections 410 of the frame 402 would essentially be the same and is therefore not provided. In this embodiment, the frame 402 includes side walls 408 with side edge portions 424 formed with a different configuration of mating fingers 432 and recesses 434 for providing an interlocking engagement between the side edge portions 424 of adjacent side walls 408.

As shown in FIG. 9, the interlocking side edge portions 424 engage to form generally square-shaped lower portions 438 of the corner sections 410. The side edge portions 424 of adjacent side walls 408 each include one finger 432 and one recess 434. The finger 432 and recess 434 of the side edge portions 424 of the adjacent side walls 408 are oriented to interconnect to form the generally square-shaped lower portions 438 of the corner sections 410.

Figure 10:
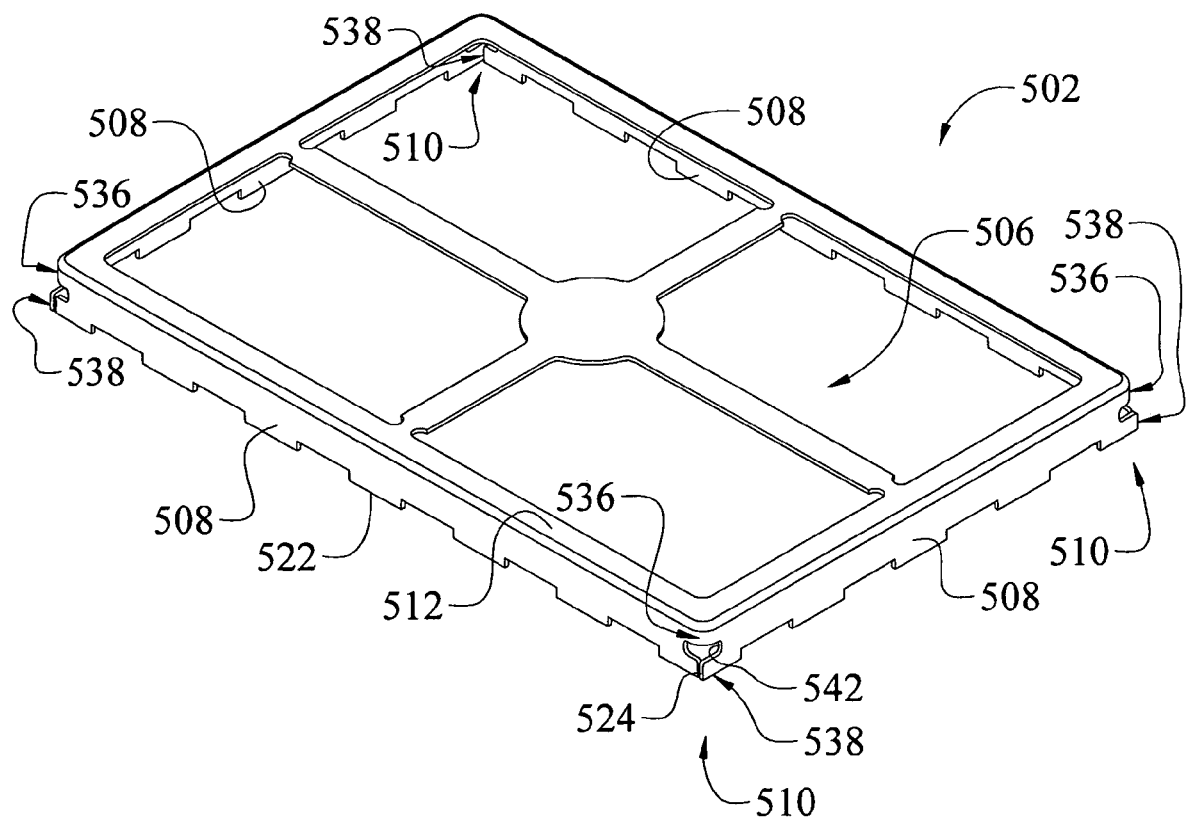
FIG. 10 is a perspective of another exemplary embodiment of a frame of a shielding apparatus in which corner sections of the frame have generally square-shaped lower portions each formed by yet another interconnection of side edge portions of adjacent side walls.

FIG. 10 illustrates a frame 502 according to another exemplary embodiment. In this embodiment, the frame 502 includes side walls 508 with side edge portions 524 having no mating fingers or recesses. Instead, this embodiment has side edge portions 524 of the adjacent side walls 508 that abut each other below opening 542 to form generally square-shaped lower portions 538 of corner sections 510.

Figure 11:
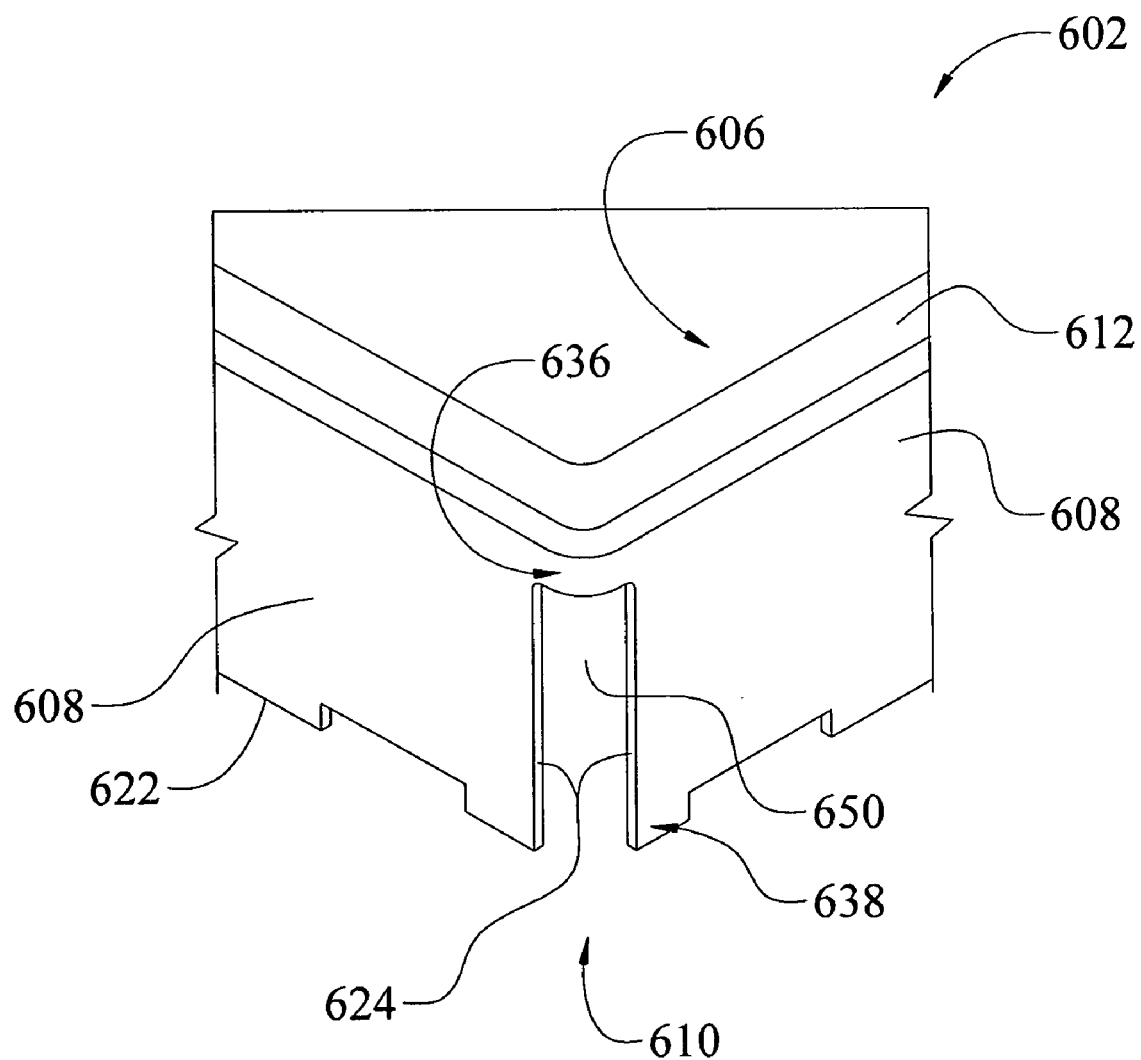
FIG. 11 is a partial perspective of another exemplary embodiment of a frame of a shielding apparatus and illustrating a corner section of the frame that includes a lower portion formed by spaced-apart side edge portions of adjacent side walls.

FIG. 11 illustrates a corner section 610 of a frame 602 according to yet another exemplary embodiment. While only one corner section 610 is illustrated in FIG. 11 and described hereinafter, a description of the other corner sections 610 of the frame 602 is the same. In this embodiment, the frame 602 includes side walls 608 with side edge portions 624 having no mating fingers or recesses. Instead, the side edge portions 624 of adjacent side walls 608 are separated by a spaced distance or gap 650 generally below upper drawn portion 636 of the corner section 610. In this embodiment, the lower portion 638 of the corner section 610 is generally defined by the space 650 and the spaced-apart side edge portions 624 of adjacent side walls 608.

Figure 12:
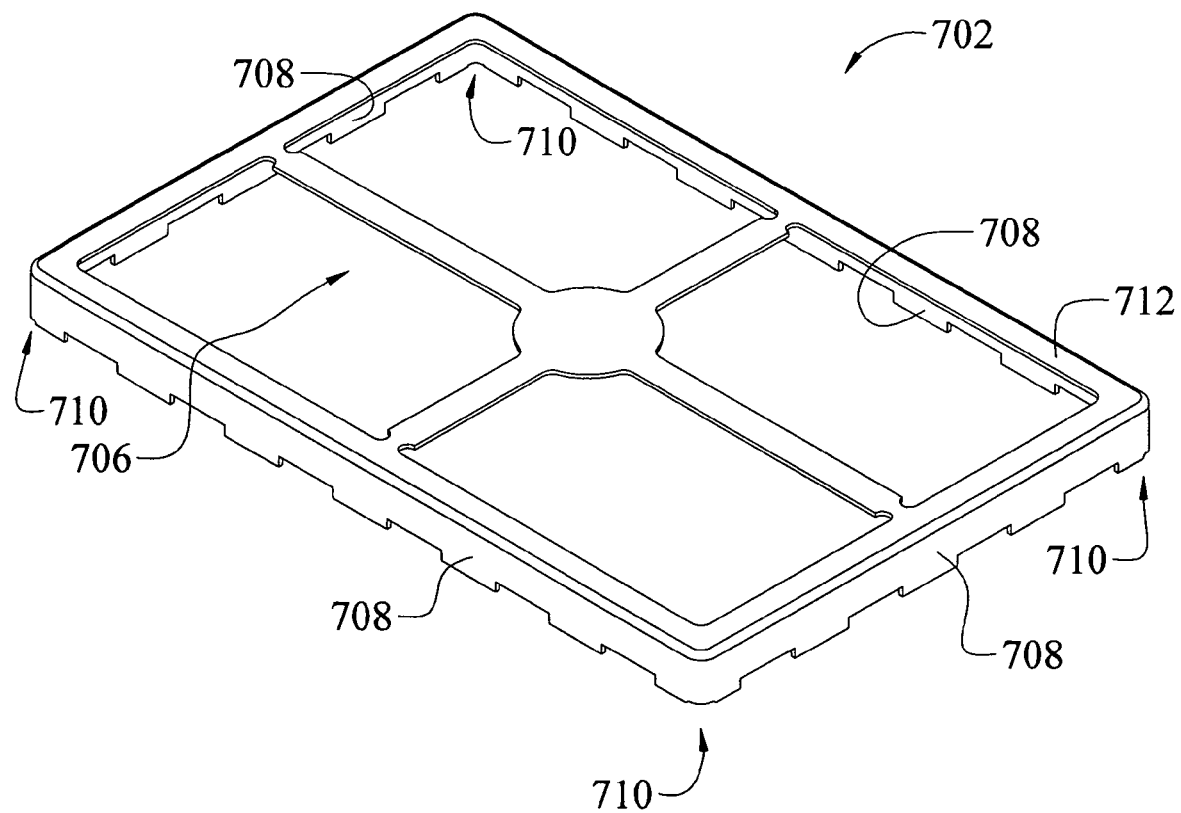
FIG. 12 is a perspective of another exemplary embodiment of a frame of a shielding apparatus.
Figure 13:
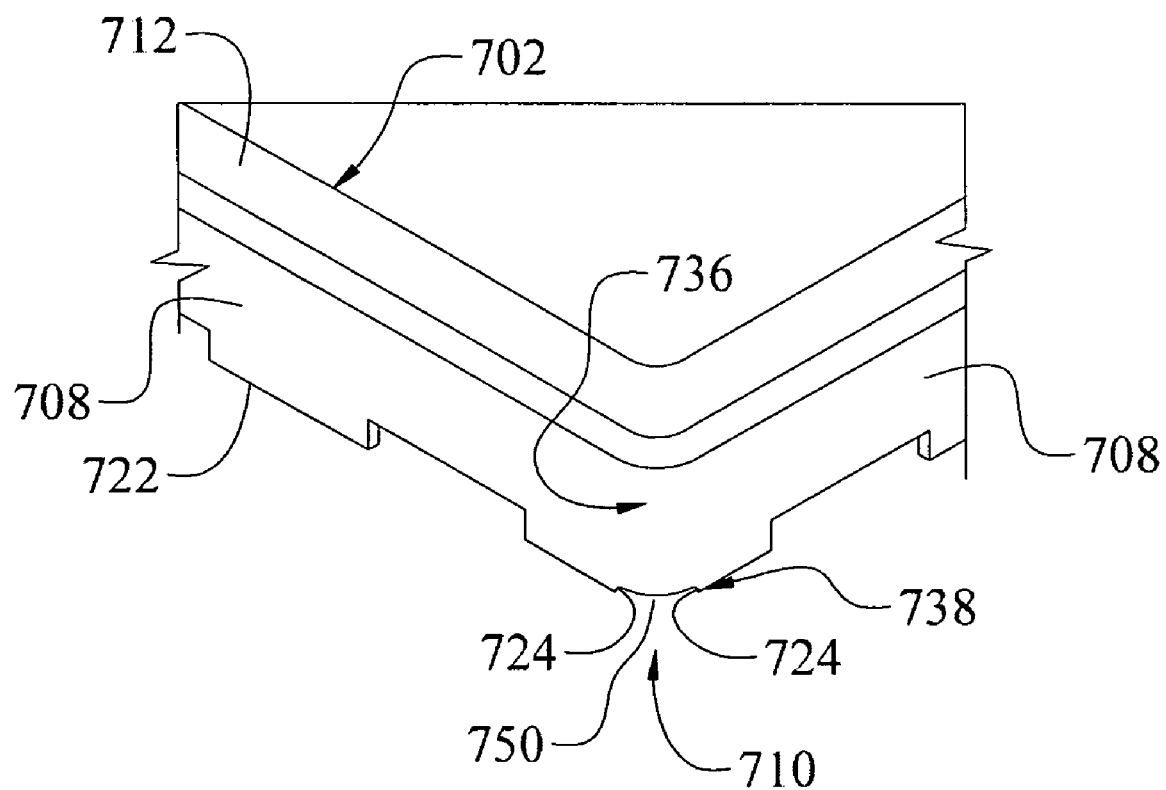
FIG. 13 is a partial perspective of the frame shown in FIG. 12 and illustrating a corner section of the frame that includes a lower portion formed by spaced-apart side edge portions of adjacent side walls.

FIGS. 12 and 13 illustrate a frame 702 according to still another exemplary embodiment. In this embodiment, the frame 702 includes side walls 708 with side edge portions 724 having no mating fingers or recesses. Instead, the side edge portions 724 of adjacent side walls 708 are separated by spaces or gaps 750 below upper drawn portions 736 of corner sections 710. Thus, lower portions 738 of the corner sections 710 are generally defined by the spaces 750 and the spaced-apart side edge portions 724 of the adjacent side walls 708. As shown in FIG. 13, the upper drawn portion 736 of each corner section 710 extends downwardly from an upper surface 706 of the frame 702 to a greater extent than does the drawn portions 636 of the frame 602 shown in FIG. 11. In FIG. 13, more of the frame's corner section 710 is formed by drawing than that which is formed by bending or folding. The extent to which a corner section of a frame, lid, shielding can, etc. is formed by drawing as compared to folded or bending may vary depending, for example, on the particular application.

Figure 14:
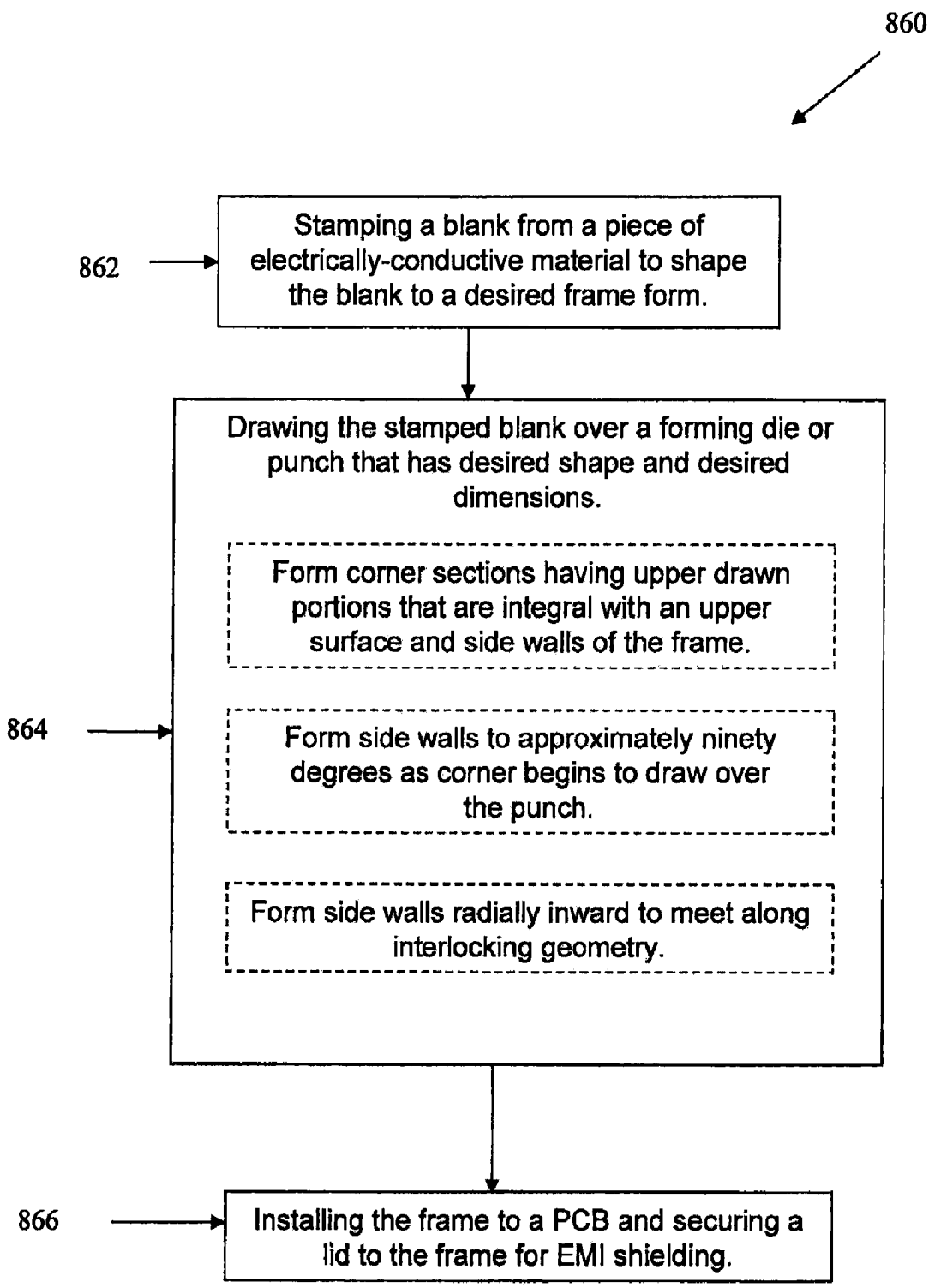
FIG. 14 illustrates an exemplary method for making a shielding apparatus according to exemplary embodiments.

FIG. 14 schematically illustrates an exemplary method 860 for making a shielding apparatus according to embodiments of the present disclosure. With this exemplary method 860, any of wide range of shielding apparatus may be made, such as an EMI shielding apparatus (e.g., 100, etc.) having a frame (e.g., 102, 202, 303, 402, 502, 602, 702, etc) and/or a single-piece shielding can. As shown at process 862, a piece of material (e.g., a blank, etc.) is first stamped from a larger piece of electrically-conductive material(s) in the general form of, for example, a frame (e.g., 102, 202, 303, 402, 502, 602, 702, etc.). The form of the blank is generally flat and may include an upper surface (e.g., 106, 206, 306, 406, 506, 606, 706, etc.) with flanges (e.g., 112, 212, 312, 412, 512, 612, 712, etc.) integral with side walls (e.g., 108, 208, 308, 408, 508, 608, 708, etc.) having side edge portions (e.g., 124, 224, 324, 424, 524, 624, 724, etc.) and lower edge portions (e.g., 122, 222, 322, 422, 522, 622, 722). In the blank, the side walls (e.g., 108, 208, 308, 408, 508, 608, 708, etc.) radiate generally outwardly from the upper surface flanges (e.g., 112, 212, 312, 412, 512, 612, 712, etc.) so that the side edge portions (e.g., 124, 224, 324, 424, 524, 624, 724, etc.) of adjacent side walls are spaced-apart. In some exemplary embodiments, the blank may be formed from the larger piece of material by a die stamping process. In other exemplary embodiments, the blank may be formed from the larger piece of material by chemical milling, or by any other suitable process.

As indicated at process 864, the stamped blank is then formed. During this forming process 864, the stamped blank is drawn or pulled over a forming die or punch. This forms corner sections (e.g., 110, 210, 310, 410, 510, 610, 710, etc.) having drawn portions (e.g., 136, 236, 336, 436, 536, 636, 736, etc.) integrally connecting corresponding flanges (e.g., 112, 212, 312, 412, 512, 612, 712, etc.) and adjacent side walls (e.g., 108, 208, 308, 408, 508, 608, 708, etc.). The drawn portions (e.g., 136, 236, 336, 436, 536, 636, 736) of the corner sections (e.g., 110, 210, 310, 410, 510, 610, 710, etc.) along with the integrally connected side walls (e.g., 108, 208, 308, 408, 508, 608, 708, etc.) depend generally downward from the flanges (e.g., 112, 212, 312, 412, 512, 612, 712, etc.).

In addition to forming the drawn portions during process 864, the side walls are also formed during the same process 864. In other words, the side walls are formed along with the drawn portions during the same process or operation 864 (and not in a separate distinct operation according to this exemplary embodiment). As the blank is being formed during operation 864, the side walls are formed up to approximately ninety degrees as the corners begin to draw over the forming punch.

As the drawing process continues at operation 864, the side edge portions (e.g., 124, 224, 324, 424, etc.) of the adjacent side walls (e.g., 108, 208, 308, 408, etc.) are formed radially inward to meet along the chosen interlocking geometry, if any. As disclosed herein, the interlocking geometry may include mating or interconnecting fingers (e.g., 132, 232, 332, 432, etc.) and recesses (e.g., 134, 234, 334, 434, etc.) for providing an interlocking engagement between the side edge portions of adjacent side walls. In other exemplary methods, the side edge portions (e.g., 524, etc.) of the adjacent folded side walls (e.g., 608, etc.) may abut. In still other exemplary methods, the side edge portions (e.g., 624, 724, etc.) of the adjacent folded side walls (e.g., 608, 708, etc.) may be spaced apart by a space or gap (e.g., 650, 750, etc.).

With further reference to FIG. 14, process 866 may include the finally-formed frame (e.g., 102, 202, 303, 402, 502, 602, 702, etc) being be disposed generally about one or more electrical components (e.g., 101 in FIG. 1) on a PCB (e.g., 103 in FIG. 1) and installed (e.g., soldered, adhesively bonded, clipped onto, etc.) to the PCB. A lid (e.g., 104, etc.) may then be secured to the frame (e.g., 102, 202, 302, 402, 502, 602, 702, etc), and together the frame and lid may be used to shield electrical components on the PCB inside and/or outside the frame from EMI.

It can be seen that the embodiments of shielding apparatus disclosed herein include corner sections (e.g., 110, 210, 310, 410, 510, 610, 710, etc.) that are formed partly by drawing a piece of material and partly by folding, bending, or otherwise forming the piece of material. The drawing process 864 may advantageously provide improved strength to a shielding apparatus over those shields having side walls formed solely by folding. As disclosed herein, shielding apparatus, frames (e.g., 102, 202, 302, 402, 502, 602, 702, etc), and/or single-piece shielding cans may include an integral, monolithic construction between side walls such that drawn portions of the corner sections (e.g., 110, integrally connect the adjacent side walls with the upper surfaces. This one-piece construction of the drawn portions, adjacent side walls, and upper surfaces preferably provides improved strength and rigidity over a traditional folded construction. In addition, the process 864 during which lower portions of the side walls (e.g., 108, 208, 308, 408, 508, 608, 708, etc.) are folded or bent to a final form preferably eliminates the need for a draw flange along lower edge portions (e.g., 122, 222, 322, 422, 522, 622, 722) of the side walls, which is typically common in traditional all-drawn constructions. This exemplary method also preferably eliminates the extra space typically needed on the PCB for an all-drawn construction. This, in turn, may help promote a more accurate and consistent fit of the lower edge portions (e.g., 122, 222, 322, 422, 522, 622, 722) with a PCB (e.g., 103 in FIG. 1).

The materials and dimensions provided herein are for purposes of illustration only, as the assembly and components thereof can be configured from different materials and/or with different dimensions depending, for example, on the particular application, such as the component to be shielded, space considerations within the overall apparatus, EMI shielding and heat dissipation needs, and other factors.

The terms "integral" and "monolithic" are interchangeably used herein. Use of one term instead of the other term is not intended to be limiting. Both terms are intended to describe the one-piece constructions disclosed herein for shielding apparatus, such as the frames 102, 202, 302, 402, 502, 602, 702, etc. As disclosed herein, various embodiments include a construction in which the upper surfaces (e.g., 106, 206, 306, 406, 506, 606, 706, etc.), side walls (e.g., 108, 208, 308, 408, 508, 608, 708, etc.), and upper drawn portions (e.g., 136, 236, 336, 436, 536, 636, 736) of corner sections (e.g., 110, 210, 310, 410, 510, 610, 710, etc.) are all formed as one piece. This one-piece construction is intended when using the terms "integral" and "monolithic" and variations thereof.

Certain terminology is used herein for purposes of reference only, and thus is not intended to be limiting. For example, terms such as "upper", "lower", "above", "below", "top", and "bottom" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

what is claimed is:

1. A shielding apparatus suitable for use in providing electromagnetic interference shielding for one or more electrical components on a substrate, the shielding apparatus comprising:

side walls configured to be disposed generally about one or more electrical components on a substrate;

corner sections integrally formed with the side walls, each corner section having:

a drawn portion integrally connecting a corresponding pair of side walls;

a lower portion located generally below the drawn portion and generally between side edge portions of the corresponding pair of side walls;

a top surface integrally formed with the side walls and drawn portions such that the side walls and drawn portions depend downwardly relative to the top surface with the drawn portions integrally connecting the corresponding side walls and the top surface, and wherein the top surface extends across the shielding apparatus from side wall to side wall, whereby the shielding apparatus is operable for shielding one or more electrical components on the substrate that are within an interior cooperatively defined by the side walls, corner sections, top surface, and at least a portion of the substrate.

2. A shielding apparatus suitable for use in providing electromagnetic interference shielding for one or more electrical components on a substrate, the shielding apparatus comprising:
  side walls configured to be disposed generally about one or more electrical components on a substrate;
  corner sections integrally formed with the side walls, each corner section having:
    a drawn portion integrally connecting a corresponding pair of side walls;
    a lower portion located generally below the drawn portion and generally between side edge portions of the corresponding pair of side walls;
  a top surface integrally formed with the side walls and drawn portions such that the side walls and drawn portions depend downwardly relative to the top surface with each drawn portion integrally connecting a corresponding pair of side walls and the top surface.

3. The shielding apparatus of claim 2, further comprising a draw line between each side wall and the top surface such that each side wall is generally perpendicular to the top surface.

4. The shielding apparatus of claim 2, wherein the top surface defines an opening along an upper portion of the shielding apparatus.

5. The shielding apparatus of claim 4, further comprising a lid to cover the opening defined by the top surface, whereby the shielding apparatus is operable for shielding one or more electrical components on the substrate that are within an interior cooperatively defined by the side walls, corner sections, top surface, lid, and at least a portion of the substrate.

6. The shielding apparatus of claim 2, wherein the top surface, side walls, and corner sections are integrally formed from a single piece of electrically-conductive material so as to have a monolithic construction.

7. The shielding apparatus of claim 2, wherein the top surface is defined by the top edges of the side walls.

8. The shielding apparatus of claim 2, wherein the side edge portions of the side walls are keyed for interconnection at the lower portions of the corner sections for helping ensure proper alignment of the side walls relative to one another.

9. The shielding apparatus of claim 2, wherein at least one of the side walls includes a lower edge portion with castellations.

10. The shielding apparatus of claim 2, wherein at least one of the side walls includes a lower edge portion substantially free of draw flanges and generally co-planar with the lower edge portions of the other side walls.

11. The shielding apparatus of claim 2, wherein the lower portions of the corner sections include seams formed by the side edge portions of the corresponding pair of side walls.

12. The shielding apparatus of claim 2, wherein at least one of the corner sections further includes an opening cooperatively defined by the drawn portion and lower portion of the corner section.

13. The shielding apparatus of claim 2, wherein the side edge portions of at least one of the corresponding pair of the side walls are separated by a spaced distance at the lower portion of the corresponding corner section.

14. The shielding apparatus of claim 2, wherein the drawn portions of the corner sections are configured to increase rigidity of the shielding apparatus.

15. A shielding apparatus suitable for use in providing electromagnetic interference shielding for one or more electrical components on a substrate, the shielding apparatus comprising:
  side walls configured to be disposed generally about one or more electrical components on a substrate;
  corner sections integrally formed with the side walls, each corner section having:
    a drawn portion integrally connecting a corresponding pair of side walls;
    a lower portion located generally below the drawn portion and generally between side edge portions of the corresponding pair of side walls;
  flanges integrally formed with the side walls and drawn portions such that the side walls and drawn portions depend downwardly relative to the flanges with the drawn portions integrally connecting the corresponding side walls and flanges, and wherein the flanges extend inwardly relative to the side walls so as to define an opening along an upper portion of the shielding apparatus.

16. The shielding apparatus of claim 15, further comprising a lid to cover the opening, whereby the shielding apparatus is operable for shielding one or more electrical components on the substrate that are within an interior cooperatively defined by the side walls, corner sections, flanges, lid, and at least a portion of the substrate.

17. The shielding apparatus of claim 15, wherein the flanges, side walls, and corner sections are integrally formed from a single piece of electrically-conductive material so as to have a monolithic construction.

18. The shielding apparatus of claim 15, further comprising a draw line between each side wall and the corresponding flange such that the side walls are generally perpendicular to the flanges.

19. A shielding apparatus suitable for use in providing electromagnetic interference shielding for one or more electrical components on a substrate, the shielding apparatus comprising:
  an upper surface;
  side walls integrally formed with and downwardly depending from the upper surface, the side walls configured to be disposed generally about one or more electrical components on a substrate, the side walls having side edges each configured for interlocking engagement with a side edge of a corresponding adjacent side wall;
  corner sections integrally formed with the side walls and the upper surface, each corner section having:
    a drawn portion integrally connecting a corresponding pair of side walls and the upper surface, the drawn portion downwardly depending relative to the upper surface;
    a lower portion located generally below the drawn portion, the lower portion including a seam formed by the interlocking engagement of the side edges of the corresponding pair of side walls; and
    an opening cooperatively defined by the drawn portion and the lower portion of the corner section.

20. The shielding apparatus of claim 19, further comprising flanges defining the upper surface and inwardly extending from the side walls so as to define an opening therebetween, and wherein the shielding apparatus further comprises a lid to cover the opening, whereby the shielding apparatus is operable for shielding one or more electrical components on the substrate that are within an interior defined by the side walls, corner sections, upper surface, lid, and at least a portion of the substrate.

21. The shielding apparatus of claim 19, wherein the upper surface, side walls, and corner sections are integrally formed from a single piece of electrically-conductive material so as to have a monolithic construction.

22. The shielding apparatus of claim 19, wherein the side edges of the side walls are keyed for interconnection at the lower portions of the corner sections for helping ensure proper alignment of the side walls relative to one another.

23. The shielding apparatus of claim 19, further comprising a draw line between each side wall and the upper surface such that each side wall is generally perpendicular to the upper surface.

24. The shielding apparatus of claim 19, wherein at least one of the side walls includes a lower edge portion substantially free of draw flanges and generally co-planar with the lower edge portions of the other side walls.

25. The shielding apparatus of claim 19, wherein the upper surface extends across the shielding apparatus from side wall to side wall, whereby the shielding apparatus is operable for shielding one or more electrical components on the substrate that are within an interior cooperatively defined by the side walls, corner sections, upper surface, and at least a portion of the substrate.

26. A method for making an electromagnetic interference shielding apparatus having an upper surface, side walls downwardly depending from the upper surface, and corner sections generally between each corresponding pair of side walls, the method comprising drawing a piece of material so as to form a drawn portion for each corner section downwardly depending relative to the upper surface and integrally connecting a corresponding pair of side walls and the upper surface, and to form the side walls generally perpendicularly to the upper surface such that each corner section includes a lower portion located generally below the drawn portion and generally between side edge portions of the corresponding pair of side walls, the upper surface integrally formed with the side walls and drawn portions such that the side walls and drawn portions depend downwardly relative to the upper surface with each drawn portion integrally connecting a corresponding pair of side walls and the upper surface.

27. The method of claim 26, wherein drawing further includes forming the side edge portions of the side walls inwardly to thereby interlock the side edge portions to each other.

28. The method of claim 27, wherein drawing includes bending or folding the side walls.

29. The method of claim 26, further comprising forming the piece of material as a blank from a larger sheet of electrically-conductive material before drawing the piece of material.

30. The method of claim 29, wherein forming the piece of material as a blank comprises at least one or more of stamping or chemically milling the piece of material as the blank from the larger sheet of electrically-conductive material.

* * * * *